United States Patent [19]

Doyle

[11] Patent Number: 5,586,130
[45] Date of Patent: Dec. 17, 1996

[54] METHOD AND APPARATUS FOR DETECTING FAULT CONDITIONS IN A VEHICLE DATA RECORDING DEVICE TO DETECT TAMPERING OR UNAUTHORIZED ACCESS

[75] Inventor: Thomas F. Doyle, San Diego, Calif.

[73] Assignee: Qualcomm Incorporated, San Diego, Calif.

[21] Appl. No.: 316,746

[22] Filed: Oct. 3, 1994

[51] Int. Cl.$^6$ ............... G01D 9/00; G01D 3/00; G06F 11/00
[52] U.S. Cl. ............ 371/62; 371/61; 364/424.04; 346/33 D; 324/110; 377/19; 377/20; 377/24.1; 340/438; 340/439
[58] Field of Search ............ 395/575; 346/33 R, 346/33 D; 324/110; 368/8; 377/15, 16, 19, 20, 23, 24, 24.1; 371/60, 61, 62; 364/424.03, 424.04; 340/438, 439

[56] References Cited

U.S. PATENT DOCUMENTS

| | | | |
|---|---|---|---|
| 4,067,061 | 1/1978 | Juhasz | 395/550 |
| 4,188,618 | 2/1980 | Weisbart | 340/870.16 |
| 4,258,421 | 3/1981 | Juhasz et al. | 364/424.04 |
| 4,595,932 | 6/1986 | Ruhl | 346/33 R |
| 4,656,488 | 4/1987 | Ruhl | 346/49 |
| 4,705,970 | 11/1987 | Turnpaugh | 327/31 |
| 4,941,136 | 7/1990 | Breitung, II | 368/8 |
| 5,253,224 | 10/1993 | Van Doesburg | 368/10 |
| 5,303,163 | 4/1994 | Ebaugh et al. | 364/550 |
| 5,359,528 | 10/1994 | Haendel et al. | 364/424.04 |

Primary Examiner—Robert W. Beausoliel, Jr.
Assistant Examiner—Phillip F. Vales
Attorney, Agent, or Firm—Russell B. Miller

[57] ABSTRACT

A system and method for detecting fault conditions within a vehicle recording device are disclosed herein. The fault detection technique may be implemented in a vehicle in which are incorporated one or more vehicle sensors for monitoring one or more operational parameters of the vehicle. A recording device disposed within the vehicle is used to collect vehicle operation data produced by the one or more vehicle sensors.

The fault detection technique of the invention contemplates storing a current time value at regular intervals during periods in which the recording device is provided with a source of main power. Time differences are determined between consecutive ones of the stored time values, and the time differences compared to a predetermined maximum value. A power loss fault condition is registered when at least one of the time differences exceeds the predetermined maximum value. In a preferred implementation an indication of the existence of the power loss fault condition is transmitted to a central control station.

Fault detection may also be effected within a vehicle recording device by repeatedly storing a cumulative value of an operational parameter registered by a sensor unit incorporated within the vehicle. The last stored cumulative value is compared to a cumulative value currently registered the sensor unit, and difference value is determined therebetween. A fault condition is indicated when the difference value exceeds a predetermined maximum value. Again, an indication of the existence of the fault condition may then be transmitted to a central control station.

19 Claims, 3 Drawing Sheets

METHOD AND APPARATUS FOR DETECTING FAULT CONDITIONS IN A VEHICLE DATA RECORDING DEVICE TO DETECT TAMPERING OR UNAUTHORIZED ACCESS

BACKGROUND OF THE INVENTION

I. Field of the Invention

The present invention relates to vehicle monitoring and control systems. More specifically, the present invention relates to a novel and improved method and apparatus for detecting fault conditions within vehicle data recording devices.

II. Description of the Related Art

Recently, trucking and delivery vehicles have been equipped with a variety of electronic sensors and monitoring devices. Such instrumentation may be utilized to monitor parameters such as vehicle speed, engine speed (RPM), and fuel consumption. The data accumulated by these and other on-board vehicle sensors will typically be directly provided to a vehicle recording device. As an alternative, vehicle operational and performance data may be collected by other vehicle electronic units disposed to monitor vehicle sensors. The collected data is then transferred to the recording device over an internal vehicle data link.

The accumulated data within the on-board recorder is periodically transferred, or "downloaded", to a host processing facility or central control center. This transfer process has hitherto been performed by manually disengaging the recording device from the vehicle and accessing it within the host facility. Unfortunately, such manual data transfer requires either that each vehicle within a fleet periodically visit the host facility, or that other arrangements be provided for physical transport of the recording device. Besides being inconvenient, such manual data transfer techniques prevent timely updates from being made to databases used for fleet management and control.

It is also known that hardware failures within the vehicle sensing and data recording apparatus may result in errors being introduced into the accumulated vehicle data. For example, if an electrical system failure were to cause the recording device to become temporarily disconnected from the main power source, the resulting loss of vehicle sensor data would typically lead to underestimation of a number of operational parameters (e.g., miles logged, fuel consumption, and engine run time).

As a consequence, vehicle fleet operators have often been forced into performing extensive monitoring of the sensor data acquisition process as a means of verifying data integrity. Given that data collected by vehicle recording devices is often used as a measure of driver performance, there exists an incentive for drivers to tamper with or otherwise temporarily disable the data recording device. Accordingly, there is an interest not only in the detection of genuine hardware faults within vehicle sensing and data recording apparatus, but also in the identification of incidents of operator tampering or device disablement. Since under certain circumstances intentional tampering may be even be more difficult to detect than actual hardware faults, a need exists for even more sophisticated data verification measures.

Accordingly, it is an object of the invention to provide a diagnostic procedure for detecting hardware faults within on-board vehicle data recording systems.

It is another object of the invention to identify instances of tampering with such on-board recording systems.

It is still a further object of the invention to provide for real-time reporting of accumulated on-board vehicle operational data and fault conditions to a central or host processing facility.

SUMMARY OF THE INVENTION

In summary, these and other objects are met by a system and method for detecting fault conditions within a vehicle recording device. The inventive method of fault detection may be implemented in a vehicle in which are incorporated one or more vehicle sensors for monitoring one or more operational parameters of the vehicle. A recording device disposed within the vehicle is used to collect vehicle operation data produced by the one or more vehicle sensors.

In one aspect, the fault detection technique of the invention contemplates storing a current time value at regular intervals during periods in which the recording device is operating. Time differences are determined between consecutive ones of the stored time values, and the time differences compared to a predetermined maximum value. In a preferred implementation the maximum value is defined by a timer module, which sets the maximum period of time during which the device remains non-operational in a power-saving mode. A power loss fault condition is registered when at least one of the time differences exceeds the predetermined maximum value. In a preferred implementation an indication of the existence of the power loss fault condition is transmitted to a central control station.

In another aspect, the present invention effects fault detection within a vehicle recording device by repeatedly storing a cumulative value of an operational parameter registered by a sensor unit incorporated within the vehicle. The last stored cumulative value is compared to a cumulative value currently registered the sensor unit, and a difference value is determined therebetween. A fault condition is indicated when the difference value exceeds a predetermined maximum value. Again, an indication of the existence of the fault condition may then be transmitted to a central control station.

In yet another aspect of the invention, a vehicle is equipped with first and second vehicle sensors for measuring first and second operational parameters of the vehicle. A recording device is provided for collecting data produced by the first and second vehicle sensors. In a preferred implementation, data produced by the first and second vehicle sensors is monitored during predetermined periods. A fault condition is indicated upon the first vehicle sensor producing data within a first predetermined range during periods when data produced by the second vehicle sensor is in a second predetermined range.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

I. Introduction

The various techniques contemplated by the present invention for detecting fault conditions within on-board vehicle recording devices may be advantageously implemented within vehicle fleets equipped for radio communication with a base station or host processing facility. Although the fault detection techniques described herein are of utility even in the absence of such a radio communications link, the existence thereof facilitates real-time updates to vehicle performance databases, and obviates the need for manual transfer of the accumulated performance data to the host processing facility. Accordingly, in order to provide appropriate background an exemplary radio communications network facilitating information exchange between a base station and a vehicle fleet will be described with reference to FIG. 1.

Figure 1:
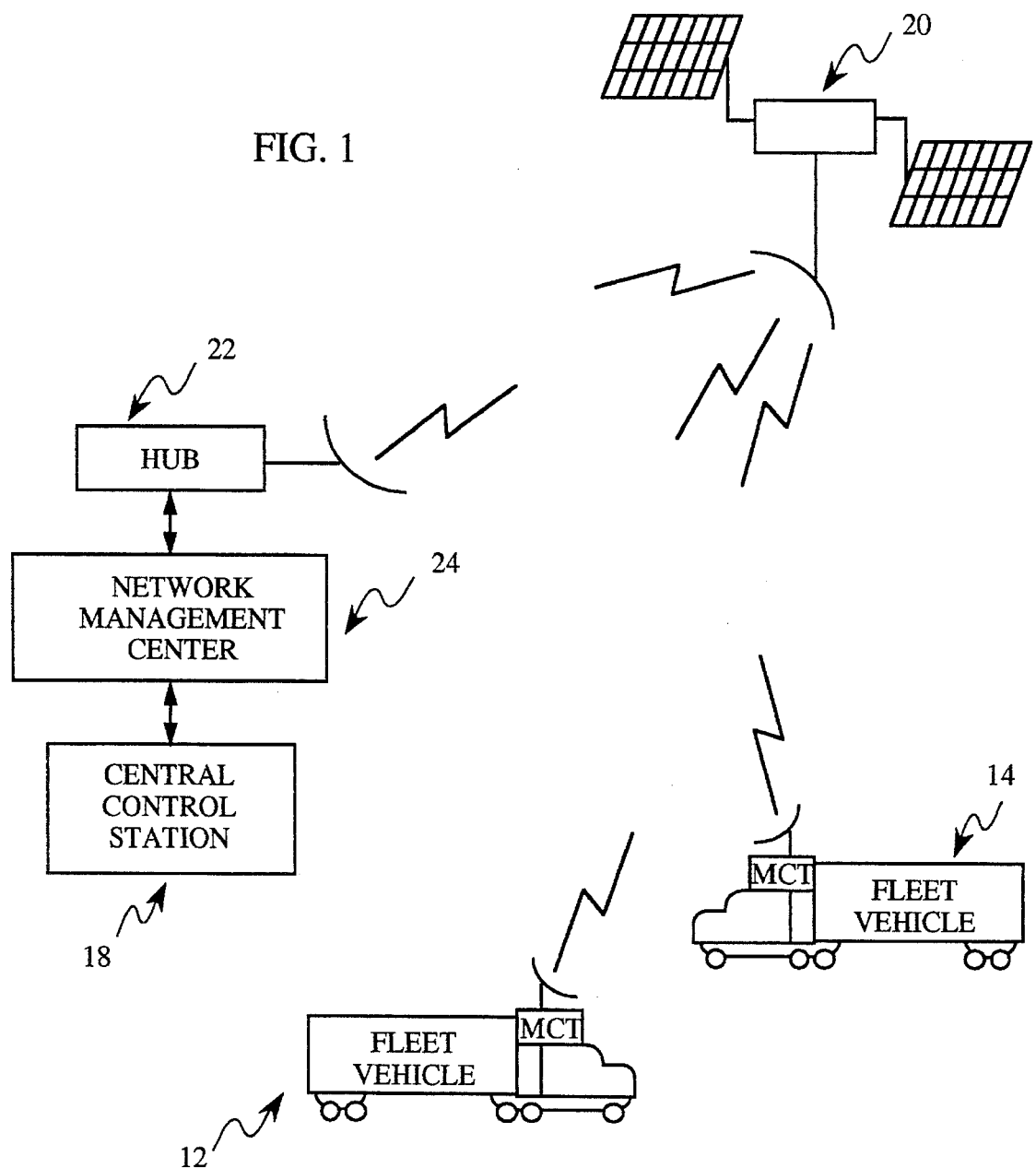
FIG. 1 depicts an exemplary implementation of a mobile communications network.

Referring to FIG. 1, the mobile communications network may comprise, for example, a conventional cellular communication system designed to provide service between user vehicles within specified geographic areas, or "cells". Alternately, the present invention may be embodied within a satellite communication system of the type capable of facilitating communication between one or more central control stations and a plurality of user vehicles distributed over a wide geographic area. Such a satellite-based message communication system is described in, for example, U.S. Pat. No. 4,979,170, entitled ALTERNATING SEQUENTIAL HALF DUPLEX COMMUNICATION SYSTEM, which is assigned to the assignee of the present invention and which is herein incorporated by reference.

Referring now to FIG. 1 in greater detail, an overview is provided of a communication network 10 within which fleet vehicles 12, 14 communicate with a central control station 18. In FIG. 1, the fleet vehicles 12, 14 each have a mobile communications terminal (MCT). The fleet vehicles 12, 14 are representative of any of a variety of vehicles (e.g., freight trucks) whose drivers or other occupants desire to obtain occasional or updated information, status reports, or messages from a central control station 18. Although the communication network of FIG. 1 relies upon a satellite communication link between the vehicles 12, 14 and the central control station 18, it is again noted that the teachings of the present invention are equally applicable to terrestrial cellular or mobile radio communications systems in which communication is established between a central facility and one or more mobile units.

The mobile communications terminal (MCT) of each fleet vehicle also allows the vehicle driver or occupant to communicate via satellite at least some form of limited message or acknowledgement to the central control station in response to received messages. A reply message may prevent the need for further communications or may indicate a need for an additional instruction or updated message from new information provided by a vehicle driver. The return link allows a driver to send messages via the mobile communications terminal such as a verification of time and delivery information, or a report on current position or other status information.

As is described hereinafter, in a preferred embodiment of the invention each MCT is equipped with a vehicle recording device operatively connected to one or more vehicle sensors. Also incorporated within each MCT is a fault detection device disposed to identify fault conditions arising either from:

(i) actual failure of one or more components of the recording device, or (ii) unauthorized tampering with the recording device.

Upon detection of a fault condition using one or more of the novel techniques described herein, the MCT sends a fault indication message to a base station or host processing facility. This alerts system operators to the existence of the fault condition, and thereby prevents any erroneous vehicle operational data from corrupting measurements of, for example, driver performance or vehicle efficiency.

Referring now to FIG. 1 in greater detail, messages from the mobile communications terminals of the vehicles 12, 14 are transmitted to the satellite 20 and relayed thereby to a central transmission facility or terminal 22 referred to as a Hub facility. The central terminal or Hub 22 can be placed at a location proximate the central control station 18 allowing lower cite costs and local, direct access to transmission equipment for maintenance and system upgrade. Alternatively, the Hub 22 is located in a remote location more ideally suited for low interference ground-to-satellite transmission or reception. In this case, a telephonic, optical or satellite communication link is utilized to establish communication either directly between the Hub 22 and the central control station 18, or alternately between the Hub 22 and central control station 18 by way of a network management center (NMC) 24. When messaging is to take place not only between the vehicles 12, 14 and the central control station 18, but also between the vehicles 12, 14 and one or more service provider control stations 28, the network management center 24 enables more efficient control over the priority, access, accounting, and transfer characteristics of message data. Additional details of the communication hardware utilized in an exemplary implementation of the Hub 22 and network management center 24 are described in the aforementioned U.S. Pat. No. 4,979,170.

II. Fault Condition Detection

Figure 2:
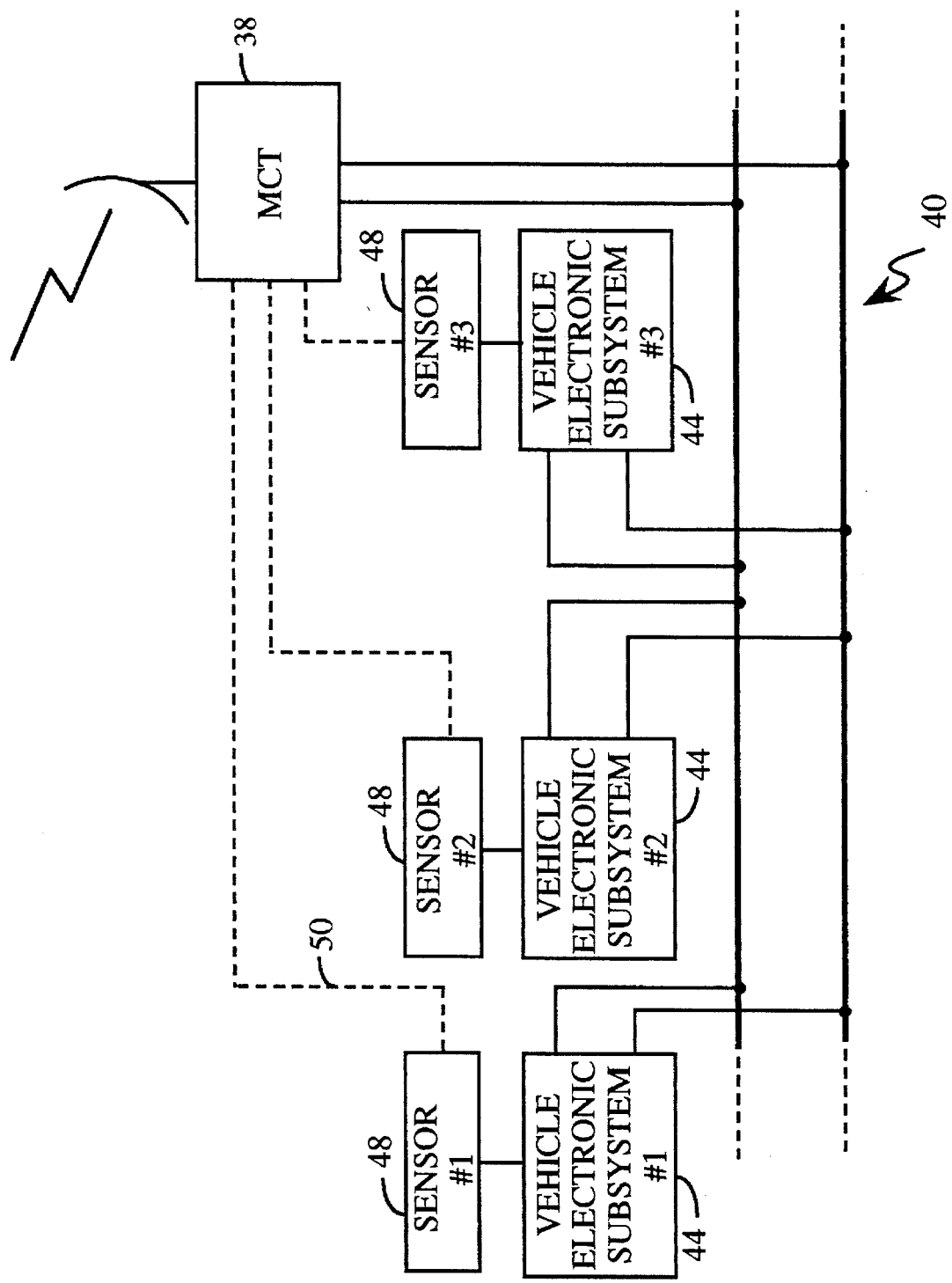
FIG. 2 shows a block diagrammatic representation of the integration of a mobile communications terminal (MCT) with the electronic control system of an exemplary fleet vehicle.

Referring now to FIG. 2, there is shown a block diagrammatic representation of the integration of a mobile communications terminal (MCT) 38 with the electronic control system of an exemplary fleet vehicle. In FIG. 2, the MCT is connected to the internal data link 40 of the vehicle upon which it is mounted. Also connected to the data link 40 are various electronic subsystems 44, which function, in part, to monitor data relating to vehicle operation produced by vehicle sensors 48. The electronic subsystems may comprise, for example, electronic engine control systems, braking systems, fuel injection systems and the like. Similarly, the vehicle sensors 48 will generally be designed to monitor operational parameters such as engine run time, vehicle speed, fuel consumption, and other parameters bearing upon operational efficiency. As is indicated by FIG. 2, the MCT 38 may optionally also be directly connected through sensor lines 50 to each of the sensors 48.

Figure 3:
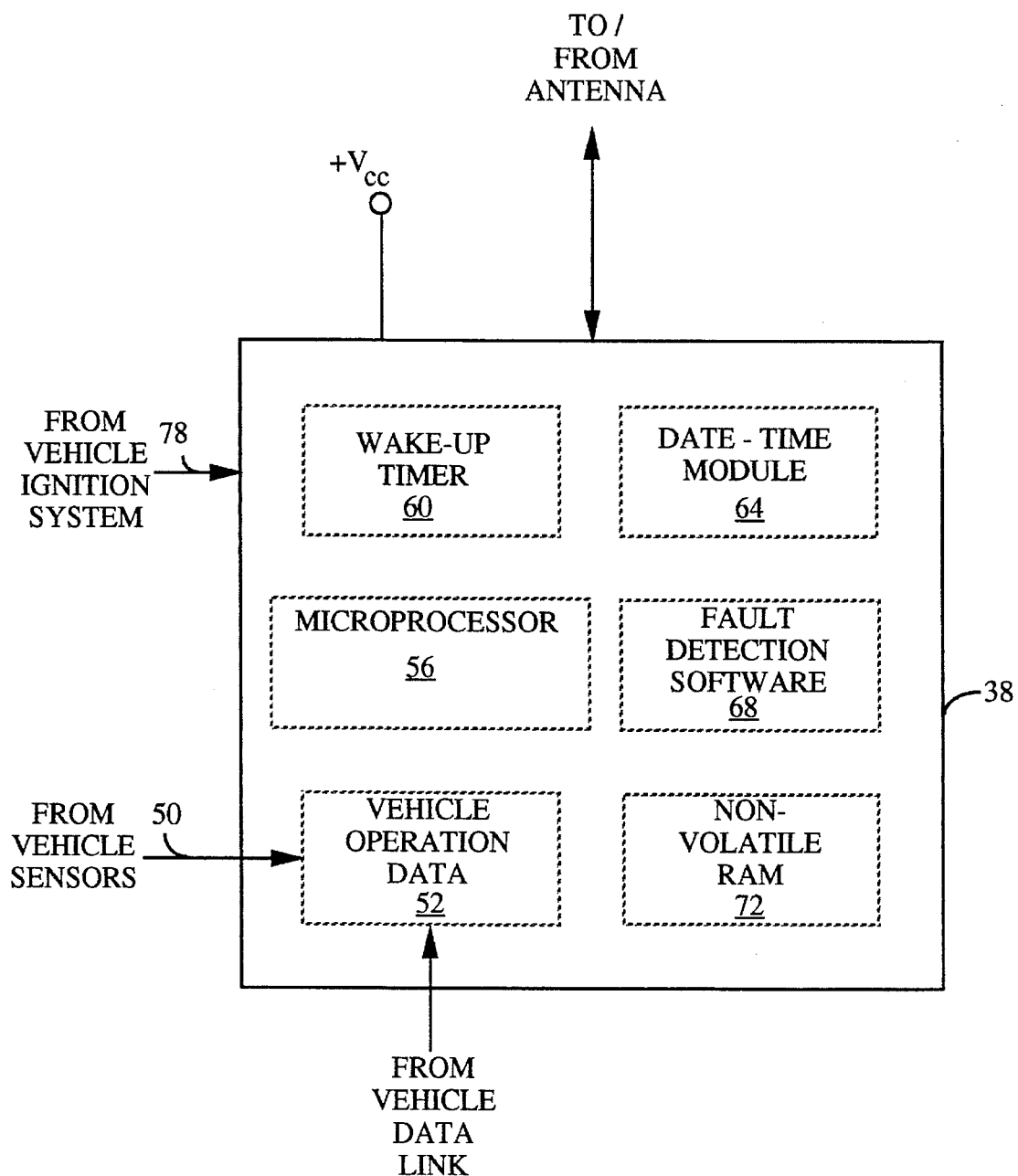
FIG. 3 provides a block diagrammatic representation of a mobile communications terminal (MCT) configured to record operational data produced by a set of vehicle sensors.

Referring now to FIG. 3, there is shown a block diagrammatic representation of the MCT 38 configured to record operational data produced by the vehicle sensors 48. As is indicated by FIG. 3, the MCT 38 includes a memory module 52 connected to receive operational data from the sensors 48. In an exemplary implementation the memory module 52 is directly connected to each of the sensors 48 through a corresponding one of the sensor lines 50. Alternately, data produced by each of the sensors 48 is accumulated in an associated electronic subsystem 44. The operational information accumulated by each vehicle sensor/subsystem pair, hereinafter referred to as a "sensor unit", is then periodically transferred to the memory module 52 over the data link 40. This transfer may be effected in accordance with, for example, standards SAE J1708 and SAE J1587 promulgated by the Society of Automotive Engineers, which respectively provide standardized electrical specifications and messaging protocols for internal vehicle data links. The SAE J1587 messaging protocol provides the format and transmission interval for communication of "free-formatted" data packets capable of transferring the sensor data, such free-formatted packets being used to transfer sensor data over the data link 40 to the MCT 38. The transmission intervals prescribed by the SAE J1587 standard are of sufficiently short duration that the data transfer may be considered to be substantially continuous.

In order to enable identification of the vehicle sensor unit from which data is received, the header of each free-formatted message packet so utilized is modified to include a unique vehicle subsystem message identifier (MID). This allows operational data within the memory module 52 of each MCT to be organized on the basis of the MIDs corresponding to the constituent vehicle sensor units.

Again with reference to FIG. 3, the MCT 38 includes a microprocessor 56 which, in addition to performing various other control functions, directs the storage of data within the memory module 52. In accordance with one aspect of the invention, there is incorporated within the MCT 38 a fault detection device comprised of a wake-up timer 60, a date-time module 64, fault detection software 68, and non-volatile random access memory (RAM) 72. For present purposes, the microprocessor 56 in conjunction with fault detection software 68 may be considered to comprise a fault detection device controller.

Upon the interruption of main power (+$V_{CC}$) to the MCT 38, the electrical components included therein become inoperative and normal data processing operations are suspended. As a consequence, vehicle operation data produced by the sensor units is not properly recorded within the memory module 52. In certain instances such loss of main power may be precipitated by an actual electrical system failure (e.g., by an electrical short circuit). Loss of main power may also arise as a consequence of intentional tampering on the part of vehicle drivers with the data recording apparatus within the MCT. Such tampering may take the form of, for example, the intentional disconnection of main power (+$V_{CC}$) by drivers engaged in unauthorized vehicle operation. It follows that there is an interest in detecting periods of loss of main power to the MCT and in identifying the existence of a fault condition corresponding thereto.

Referring again to FIG. 3, one manner in which the fault detection device of the present invention achieves these interests will now be described. During periods when the logical state of a vehicle ignition line 78 indicates that the vehicle engine has been "turned on", the MCT 38 is in a READY mode and is disposed to communicate with a base station or host processing facility. Upon engine turn-off the state of the ignition line 78 changes to the complementary logical state, and the MCT 38 enters a SLEEP mode after a predetermined initial power-down interval. During SLEEP mode, normal operation is suspended as a means of power conservation. Since messages from a base station or host facility may be received by the MCT 38 during SLEEP mode, the wake-up timer 60 periodically awakens the MCT 38 from SLEEP mode. Upon being so awakened after the wake-up interval programmed into wake-up timer 60, the MCT 38 processes any received messages and performs a variety of other control functions.

In accordance with the invention, while the MCT 38 is in READY mode the date-time module 64 regularly (e.g., every few seconds) writes the current date and time to non-volatile RAM 72. It follows that the onset of each SLEEP mode interval is marked by the last date/time entered in RAM 72. When READY mode is again entered, the time difference between the current date/time and the last date/time entry in RAM 72 should be equivalent to the programmed wake-up interval (e.g., 30 minutes). If this time difference is longer than the wake-up interval, it is presumed that a loss of main power prevented the date-time module 64 from recording the expected date/time entry upon expiration of the wake-up interval.

In a preferred embodiment, fault detection software 68 is operative to regularly compare (e.g., every few seconds) the current date/time registered by module 64 with the last date/time stored within non-volatile RAM 72. As is well known, the contents of RAM 72 are preserved even upon the interruption of main power (+$V_{CC}$) to the MCT 38. If the comparison determines the elapsed time difference to exceed the programmed wake-up interval by a predetermined margin, a loss of main power fault condition is identified and fault detection software 68 generates an error message or like type of error indication. If the comparison is performed every few seconds, then the predetermined margin will comprise a time period of at least a few seconds. The MCT 38 then transmits the error message to the base station or host processing facility, thereby alerting system operators to the existence of the identified fault condition.

In accordance with another aspect of the invention, a comparison of a different type is performed by the fault detection software 68 during each transition of the MCT 38 from SLEEP mode to READY mode. Within each vehicle electronic subsystem 44, there are typically maintained cumulative values of the operational parameters measured by the one or more vehicle sensors 48 connected thereto. For example, an engine control subsystem may continually update a "life to date" value of engine run time in response to information produced by a given engine sensor. Such cumulative or "life to date" values are periodically (e.g., every 30 seconds) recorded, by way of data link 40, within memory module 52.

Upon each resumption of READY mode operation following a SLEEP mode period, fault detection software 68 compares the last cumulative value of an operational parameter stored within memory module 52 with the current cumulative value received from the corresponding electronic subsystem. If any more than minimal difference exists between the compared values, it is clear that vehicle operation must have occurred while the MCT 38 was in SLEEP mode. Since under normal circumstances vehicle operation causes the logical state of ignition line 78 to be such that the MCT 38 is placed in the READY mode, the cumulative value of operational parameters registered by each subsystem should only change during READY mode operation of the MCT. Accordingly, any appreciable difference between the last cumulative value stored within the module 52 and the cumulative value registered by the subsystem of interest is attributable to unauthorized vehicle operation during SLEEP mode operation of the MCT 38. Discrepancy between the compared values could arise as a result of driver tampering in the form of, for example, disconnection of ignition line 78 or main power (+$V_{CC}$) from the MCT 38. Again, subsequent to identification of such a fault condition an error message may be generated by fault detection software 68 and transmitted to a base station or host facility.

It is noted that the extent of disagreement between a current cumulative parameter value, and the last cumulative value recorded within memory module 52, which is considered to constitute a fault condition will typically be dependent upon:

(i) the frequency with which the cumulative value is updated within the memory module 52, and (ii) the precision with which the operational parameter is capable of being measured.

For example, if the operational parameter FUEL CONSUMPTION is capable of being measured to within ±½ gallon, then a difference of less than ½ gallon in the compared values will not be deemed a fault condition. Similarly, if the cumulative value of the operational parameter ENGINE RUN TIME stored within memory module 52 is only updated once each minute, then a difference of 30 seconds between the compared values will typically not be considered evidence of a fault condition.

In another aspect of the present invention, fault detection is accomplished by monitoring the status of one or more vehicle subsystems as a function of the logical state of the vehicle ignition line 78. For example, fault detection software 68 could be programmed to monitor change in the cumulative value of the operational parameter ENGINE RUN TIME as a function of the ignition line logical state. When the ignition line is in an OFF state, any detected change in ENGINE RUN time will be deemed to constitute a fault condition. A nonzero ENGINE RPM or VEHICLE SPEED parameter value during periods in which the ignition line 78 is in the OFF state will similarly be considered indicative of a fault condition.

In another case, the existence of a fault condition precipitated by hardware failure or tampering with the vehicle speed sensor may be determined by monitoring an RPM signal with reference to vehicle speed for a substantial period of time (e.g., for in excess of thirty minutes). Since it has been found that engine RPM ranges are generally confined to a first range while the vehicle is stationary, and are confined to a second range while the vehicle is in transit, sustained periods of engine RPM within the second range during periods of zero vehicle speed are indicative of a fault condition. It is noted that in certain instances an engine may be run within the second range for an extended period of time, even while the vehicle is stationary, in order to provide power to an accessory vehicle unit. Such events could be precluded from giving rise to a fault condition by supplying, to the fault detection software, logical inputs indicative of such accessory operation.

In alternately preferred embodiments, the status of various other pairs of vehicle subsystems could be monitored in order to detect a fault condition within the vehicle data recording device. As an example, when vehicle drivers desire to deviate from a planned route, the driver may cover or otherwise disable the antenna of the mobile communications terminal (MCT) in order to temporarily prevent communication with a base or control station. In embodiments where such communication is facilitated by satellite relay stations, this type of tampering will prevent the MCT from receiving signals from any of these satellite relay stations. Although such a loss of satellite signal could occur due to signal blockage by buildings and other large structures, any such blockage could be expected to be intermittent and of relatively short duration. Accordingly, one technique for identifying tampering with the MCT antenna systems involves monitoring parameters such as ACCRUED MILEAGE or ENGINE RPM whenever a loss of satellite signal is detected. A change in ACCRUED MILEAGE of, for example, ten miles during a period of loss of satellite signal would never be expected to occur if the MCT antenna system were functioning properly. Hence, a loss of antenna fault condition would be detected and an indication thereof stored within non-volatile RAM 72.

In a similar manner, monitoring of engine RPM for an extended period (as described above) with reference to the existence of a received satellite signal could be employed as a means of detecting a loss of satellite signal fault condition. Specifically, an engine RPM within the range indicative of vehicle movement during an extended period without receipt of a satellite signal would be indicative of an antenna fault condition.

As another example, consider the case in which a non-zero VEHICLE SPEED is measured during an extended period of zero ENGINE RPM. This would indicate either driver tampering with the ENGINE RPM sensor, or actual failure thereof. Accordingly, in one aspect the present invention contemplates monitoring a first vehicular operation parameter with reference to another such operation parameter as a means of detecting the existence of fault conditions within the vehicle recording device.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. In a vehicle including one or more vehicle sensors for monitoring one or more operational parameters of said vehicle, said vehicle including a recording device for collecting vehicle operation data produced by said one or more vehicle sensors, a method for detecting fault conditions within said recording device comprising the steps of:

providing a wake-up signal during each of a sequence of intervals of predefined duration;

storing a current time value in response to each said wake-up signal when said recording device is provided with a source of main power;

determining time differences between consecutive ones of said stored time values; and comparing said time differences to said predefined duration, and registering a power loss fault condition when at least one of said time differences exceeds said predefined duration.

2. In a vehicle including one or more vehicle sensors for monitoring one or more operational parameters of said vehicle, said vehicle including a recording device for collecting vehicle operation data produced by said one or more vehicle sensors, a method for detecting fault conditions within said recording device comprising the steps of:

storing a current time value at regular intervals during periods in which said recording device is provided with a source of main power, said step of storing including the step of storing current time values at a first rate during periods when an ignition line of said vehicle is in a first logical state and the step of storing current time values at intervals substantially equivalent to a predetermined maximum value when said vehicle ignition line is in a second logical state;

determining time differences between consecutive ones of said stored time values; and comparing said time differences to said predetermined maximum value, and registering a power loss fault condition when at least one of said time differences exceeds said predetermined maximum value.

3. In a system including a fleet of vehicles in communication with a central control station wherein a first of said vehicles includes one or more vehicle sensors for monitoring one or more operational parameters and a mobile communications terminal linked to said one or more vehicle sensors, said mobile communications terminal including a recording device for collecting vehicle operation data produced by said one or more vehicle sensors, a method for detecting fault conditions within said recording device comprising the steps of:

provide a wake-up signal during each of a sequence of wake-up periods of predefined duration;

storing a current time value within said mobile communications terminal in response to each said wake-up signal when said recording device is provided with a source of main power;

determining time differences between consecutive ones of said stored time values;

comparing said time differences to said predefined duration: and transmitting a power loss fault condition to said central control station when at least one of said time differences exceeds said predefined duration of said wake-up periods.

4. In a system including a fleet of vehicles in communication with a central control station wherein a first of said vehicles includes one or more vehicle sensors for monitoring one or more operational parameters and a mobile communications terminal linked to said one or more vehicle sensors, said mobile communications terminal including a recording device for collecting vehicle operation data produced by said one or more vehicle sensors, a method for detecting fault conditions within said recording device comprising the steps of:

storing a current time value within said mobile communications terminal at regular intervals during periods in which said recording device is provided with a source of main power, said step of storing including the step of storing current time values at a first rate during periods when an ignition line of said vehicle is in a first logical state and the step of storing current time values at intervals substantially equivalent to a predetermined wake-up period when said vehicle ignition line is in a second logical state;

determining time differences between consecutive ones of said stored time values;

comparing said time differences to said predetermined wake-up period; and transmitting a power loss fault condition to said central control station when at least one of said time differences exceeds said predetermined wake-up period.

5. In a vehicle including one or more vehicle sensors for monitoring one or more operational parameters of said vehicle, said vehicle including a recording device for collecting vehicle operation data produced by said one or more vehicle sensors, a fault detection system for detecting fault conditions within said recording device, said system comprising:

a wake-up timer for providing a wake-up signal at a predefined rate;

a date-time module for generating a current time value at regular intervals, each of said current time values being stored within memory of said recording device at least at said predefined rate during periods in which said recording device is provided with a source of main power; and a fault detection system controller for:
(i) determining time differences between consecutive ones of said stored time values,
(ii) comparing said time differences to a predetermined maximum value related to a period of said wake-up signal, and
(iii) registering a power loss fault condition when at least one of said time differences exceeds said predetermined maximum value.

6. In a vehicle including one or more vehicle sensors for monitoring one or more operational parameters of said vehicle, said vehicle including a recording device for collecting vehicle operation data produced by said one or more vehicle sensors, a fault detection system for detecting fault conditions within said recording device, said system comprising:

a date-time module for generating a current time value at regular intervals during periods in which said recording device is provided with a source of main power, each of said current time values being stored within memory of said recording device at a first rate during periods when an ignition line of said vehicle is in a first logical state, and each of said current time values being stored at intervals substantially equivalent to a predetermined maximum value when said vehicle ignition line is in a second logical state; and a fault detection system controller for:
(i) determining time differences between consecutive ones of said stored time values,
(ii) comparing said time differences to said predetermined maximum value, and
(iii) registering a power loss fault condition when at least one of said time differences exceeds said predetermined maximum value.

7. In a system including a fleet of vehicles in communication with a central control station wherein a first of said vehicles includes one or more vehicle sensors for monitoring one or more operational parameters and a mobile communications terminal linked to said one or more vehicle sensors, said mobile communications terminal including a recording device for collecting vehicle operation data produced by said one or more vehicle sensors, a recording device fault detection system comprising:

a wake-up timer for providing a wake-up signal at a predefined rate;

a date-time module for generating a current time value at regular intervals, each of said current time values being stored within memory of said recording device at least at said predefined rate during periods in which said recording device is provided with a source of main power; and a fault detection system controller for:
(i) determining time differences between consecutive ones of said stored time values, and
(ii) comparing said time differences to a predetermined wake-up period;

wherein said mobile communications terminal is disposed to transmit a power loss fault condition to said central control station when at least one of said time differences exceeds said predetermined wake-up period.

8. The system of claim 7 wherein said date-time module operates to store current time values at a first rate during periods when an ignition line of said vehicle is in a first logical state, and to store current time values at intervals substantially equivalent to said predetermined wake-up period when said vehicle ignition line is in a second logical state.

9. In a vehicle including at least one vehicle sensor unit for monitoring an operational parameter of said vehicle and for registering a cumulative value of said parameter, said vehicle including a recording device connected to said one vehicle sensor unit, a method for detecting fault conditions within said recording device comprising the steps of:

providing a wake-up signal at a predefined rate;

repeatedly storing a cumulative value registered by said sensor unit at least at said predefined rate during periods in which said recording device is provided with a source of main power;

comparing the last stored cumulative value to a cumulative value currently registered by said sensor unit and determining a difference value therebetween; and indicating a fault condition when said difference value exceeds a period of said wake-up signal.

10. The method of claim 9 wherein said operational parameter comprises engine run time.

11. The method of claim 9 wherein said operational parameter is selected from the set consisting of: fuel consumption, distance traveled and engine idle time.

12. The method of claim 9 further including the step transmitting a message indicative of a fault condition when said difference value exceeds a predetermined value, said message being received by a base station in communication with said vehicle.

13. In a vehicle including at least one vehicle sensor unit for monitoring an operational parameter of said vehicle and for registering a cumulative value of said parameter, said vehicle including a recording device connected to said one vehicle sensor unit, a fault detection system for detecting fault conditions within said recording device, said fault detection system comprising:

means for providing a wake-up signal at a predefined rate;

a memory within said recording device; and a controller for:
repeatedly storing within said memory a cumulative value registered by said sensor unit at least at said predefined rate during periods in which said recording device is provided with a source of main power, comparing the cumulative value last stored within said memory to a cumulative value currently registered by said sensor unit and determining a difference value therebetween, and indicating a fault condition when said difference value exceeds a period of said wake-up signal.

14. The system of claim 13 wherein said operational parameter comprises engine run time.

15. The system of claim 13 wherein said operational parameter is selected from the set consisting of: fuel consumption, distance traveled and engine idle time.

16. The system of claim 13 wherein said sensor unit comprises a vehicle speed sensor.

17. The system of claim 13 wherein said sensor unit comprises a vehicle engine speed (RPM) sensor.

18. In a vehicle including one or more vehicle sensors for monitoring one or more operational parameters of said vehicle, said vehicle including a recording device for collecting vehicle operation data produced by said one or more vehicle sensors, a method for detecting fault conditions within said recording device comprising the steps of:

storing a current time value during periods in which said recording device is provided with a source of main power, said current time value being stored at a first rate when an ignition line of said vehicle is in a first state and at a second rate when said ignition line is in a second state;

determining time differences between consecutive ones of said stored time values; and comparing said time differences to a predetermined maximum value, and registering a power loss fault condition when at least one of said time differences exceeds said predetermined maximum value.

19. In a vehicle including one or more vehicle sensors for monitoring one or more operational parameters of said vehicle, said vehicle including a recording device for collecting vehicle operation data produced by said one or more vehicle sensors, a fault detection system for detecting fault conditions within said recording device, said system comprising:

means for storing a current time value during periods in which said recording device is provided with a source of main power, said current time value being stored at a first rate when an ignition line of said vehicle is in a first state and at a second rate when said ignition line is in a second state; and a fault detection controller for:
determining time differences between consecutive ones of said stored time values; and comparing said time differences to a predetermined maximum value, and registering a power loss fault condition when at least one of said time differences exceeds said predetermined maximum value.

* * * * *